(12) United States Patent
Liu

(10) Patent No.: US 12,159,836 B2
(45) Date of Patent: Dec. 3, 2024

(54) SEMICONDUCTOR STRUCTURE AND METHOD FOR FABRICATING A SEMICONDUCTOR STRUCTURE

(71) Applicant: CHANGXIN MEMORY TECHNOLOGIES, INC., Hefei (CN)

(72) Inventor: Chih-Cheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 406 days.

(21) Appl. No.: 17/516,623

(22) Filed: Nov. 1, 2021

(65) Prior Publication Data

US 2022/0384357 A1   Dec. 1, 2022

Related U.S. Application Data

(63) Continuation of application No. PCT/CN2021/120105, filed on Sep. 24, 2021.

(30) Foreign Application Priority Data

May 26, 2021   (CN) .......................... 202110579403.6

(51) Int. Cl.
*H01L 23/532* (2006.01)
*H01L 21/768* (2006.01)
*H01L 23/522* (2006.01)
*H01L 29/06* (2006.01)

(52) U.S. Cl.
CPC .. *H01L 23/53238* (2013.01); *H01L 21/76802* (2013.01); *H01L 21/76841* (2013.01); *H01L 23/5226* (2013.01); *H01L 29/0649* (2013.01)

(58) Field of Classification Search
CPC ........... H01L 23/53238; H01L 23/5226; H01L 23/481; H01L 21/76802; H01L 21/76841; H01L 21/76844; H01L 21/76898; H01L 29/0649

See application file for complete search history.

(56) References Cited

U.S. PATENT DOCUMENTS

| | | | |
|---|---|---|---|
| 6,509,267 B1 | 1/2003 | Woo et al. | |
| 9,214,411 B2 * | 12/2015 | Park | ..................... H01L 21/6835 |
| 10,950,578 B2 * | 3/2021 | Lee | ......................... H01L 24/09 |
| 2005/0098897 A1 | 5/2005 | Edelstein et al. | |

(Continued)

FOREIGN PATENT DOCUMENTS

| | | |
|---|---|---|
| CN | 1722425 A | 1/2006 |
| CN | 1913125 A | 2/2007 |

*Primary Examiner* — Dao H Nguyen
(74) *Attorney, Agent, or Firm* — Kilpatrick Townsend & Stockton LLP

(57) ABSTRACT

A semiconductor structure and a method for fabricating a semiconductor structure are provided. In the semiconductor structure, a side of a film layer structure facing away from a substrate is provided with a wiring layer, a side of the substrate facing away from the film layer structure is provided with a connecting hole extending to the wiring layer, and an insulating layer is arranged on a hole wall of the connecting hole. A barrier ring is arranged on the insulating layer, a center line of the barrier ring is arranged collinearly with a center line of the connecting hole, and diffusibility of the barrier ring is less than diffusibility of the wiring layer. A connecting post joined to the wiring layer is arranged in the connecting hole.

15 Claims, 12 Drawing Sheets

(56) References Cited

U.S. PATENT DOCUMENTS

| | | | |
|---|---|---|---|
| 2011/0089572 A1* | 4/2011 | Tezcan | H01L 23/528 |
| | | | 257/E21.011 |
| 2012/0252208 A1* | 10/2012 | Jang | H01L 21/76849 |
| | | | 438/653 |
| 2013/0015504 A1* | 1/2013 | Kuo | H01L 21/84 |
| | | | 257/E21.597 |
| 2013/0134548 A1* | 5/2013 | Torii | H01L 23/481 |
| | | | 257/508 |
| 2013/0252416 A1* | 9/2013 | Takeda | H01L 23/481 |
| | | | 438/630 |
| 2020/0357723 A1* | 11/2020 | Shohji | H01L 24/05 |

* cited by examiner

SEMICONDUCTOR STRUCTURE AND METHOD FOR FABRICATING A SEMICONDUCTOR STRUCTURE

CROSS-REFERENCE TO RELATED APPLICATION

This application is a continuation of PCT/CN2021/120105, filed on Sep. 24, 2021, which claims priority to Chinese Patent Application No. 202110579403.6 titled "SEMICONDUCTOR STRUCTURE AND METHOD FOR FABRICATING A SEMICONDUCTOR STRUCTURE" and filed to the State Intellectual Property Office on May 26, 2021, the entire contents of which are incorporated herein by reference.

TECHNICAL FIELD

Embodiments of the present disclosure relate to, but are not limited to, a semiconductor structure and a method for fabricating a semiconductor structure.

BACKGROUND

Electronic devices such as memories generally are provided with semiconductor structures. The semiconductor structure includes a substrate and a film layer structure arranged on the substrate. A contact pad is generally arranged on a side of the substrate facing away from the film layer structure, and a wiring layer is arranged on a side of the film layer structure far away from the substrate, wherein the wiring layer is a circuit pattern with a certain shape. The substrate is provided with a connecting hole penetrating to the wiring layer, and a connecting post connecting the wiring layer and the contact pad is provided in the connecting hole.

In the related technologies, when the semiconductor structure is fabricated, the film layer structure and the wiring layer are sequentially formed on the substrate, then a hole extending to the wiring layer is formed on the side of the substrate facing away from the film layer structure, and an insulating layer is formed in the hole. Next, a part of the wiring layer is etched along the hole to form a connecting hole. Next, a connecting post is formed in the connecting hole, wherein a top of the connecting post is connected to the wiring layer. Next, a contact pad is made, and the contact pad is in contact with the connecting post to implement connection between the contact pad and the wiring layer.

However, in the process of etching the wiring layer, a conductive object constituting the wiring layer may be sputtered on the insulating layer, and the conductive object is prone to diffuse on the insulating layer, which may form a leakage path of a circuit/device, such that isolation performance of the connecting post is reduced.

SUMMARY

Embodiments of the present disclosure provide a semiconductor structure, including: a substrate and a film layer structure arranged on the substrate. A side of the film layer structure far away from the substrate is provided with a wiring layer, a side of the substrate facing away from the film layer structure is provided with a connecting hole extending to the wiring layer, and an insulating layer is arranged on a hole wall of the connecting hole.

A barrier ring is arranged on the insulating layer, wherein an end of the barrier ring is joined to the wiring layer, a center line of the barrier ring is arranged collinearly with a center line of the connecting hole, and diffusibility of the barrier ring is less than diffusibility of the wiring layer. A connecting post is arranged in the connecting hole, and the connecting post is joined to the wiring layer.

The embodiments of the present disclosure also provide a method for fabricating a semiconductor structure, including:
providing a substrate, and forming a film layer structure on the substrate;
forming an annular barrier trench on a side of the film layer structure facing away from the substrate;
filling in the barrier trench with a barrier material to form a barrier ring;
forming an annular transition trench on an outside or inside of the barrier ring;
filling in the transition trench with an insulating material to form an insulating ring;
forming a wiring layer on the film layer structure;
forming, on a side of the substrate facing away from the film layer structure, a blind hole extending to the barrier ring, and forming, on a hole wall of the blind hole, an insulating sidewall in contact with the insulating ring, such that the insulating ring and the insulating sidewall constitute an insulating layer;
removing the film layer structure in the barrier ring to form a connecting hole extending to the wiring layer; and
forming, in the connecting hole, a connecting post joined to the wiring layer.

BRIEF DESCRIPTION OF THE DRAWINGS

To describe the technical solutions in the embodiments of the present disclosure or the existing technologies more clearly, the accompanying drawings required for describing the embodiments or the existing technologies will be briefly introduced below. Apparently, the accompanying drawings in the following description are merely some embodiments of the present disclosure. To those of ordinary skills in the art, other accompanying drawings may also be derived from these accompanying drawings without creative efforts.

REFERENCE NUMBERS IN THE ACCOMPANYING DRAWINGS

Figure 1:
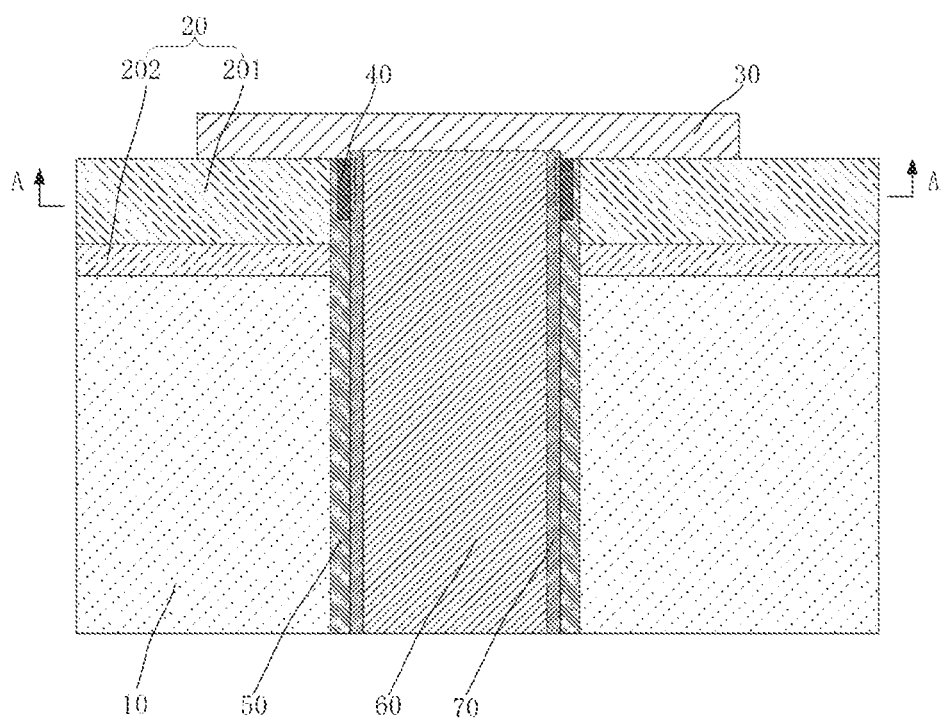
FIG. 1 is a schematic structural diagram I of a semiconductor structure according to an embodiment of the present disclosure.

10: substrate; 20: film layer structure; 30: wiring layer; 40: barrier ring; 50: insulating layer; 60: connecting post; 70: conductive buffer layer; 201: interlayer isolation layer; 202: shallow trench isolation layer; 203: barrier trench; 204: transition trench; 301: hole; 501: insulating ring; 502: insulating sidewall; 503: blind hole; and 601: connecting hole.

DETAILED DESCRIPTION

To make the objectives, technical solutions, and advantages of the embodiments of the present disclosure clearer, the technical solutions in the embodiments of the present disclosure will be described clearly and completely below with reference to the accompanying drawings in the embodiments of the present disclosure. Apparently, the described embodiments are some but not all of the embodiments of the present disclosure. All other embodiments obtained by a person of ordinary skill in the art based on the embodiments of the present disclosure without creative efforts shall fall within the protection scope of the present disclosure.

A semiconductor structure includes a substrate and a film layer structure arranged on the substrate. A contact pad is arranged on a side of the substrate facing away from the film layer structure, and a wiring layer is arranged on a side of the film layer structure far away from the substrate, wherein the wiring layer is a circuit pattern with a certain shape. The substrate is provided with a connecting hole penetrating to the wiring layer, and a connecting post connecting the wiring layer and the contact pad is provided in the connecting hole. In the process of fabricating the semiconductor structure, generally the film layer structure and the wiring layer are first formed on the substrate, then a hole extending to the wiring layer is formed on the side of the substrate far away from the film layer structure, and an insulating layer is formed on a sidewall of the hole (the insulating layer only covers the sidewall of the hole, but does not fill in the hole). Next, a part of the wiring layer is etched along the hole to form a connecting hole, and a connecting post is formed in the connecting hole, wherein a top of the connecting post is connected to the wiring layer. Next, a contact pad is made on a side of the substrate facing away from the wiring layer, and the contact pad is in contact with the connecting post to implement connection between the contact pad and the wiring layer.

However, in the process of etching the wiring layer, a conductive object constituting the wiring layer may be sputtered on the insulating layer, and the conductive object is prone to diffuse on the insulating layer, which may form a leakage path of a circuit/device, such that isolation performance of the connecting post is reduced.

This embodiment provides a semiconductor structure. A barrier ring is formed on the insulating layer covering the sidewall of the connecting hole, wherein diffusibility of the barrier ring is less than that of the conductive object constituting the wiring layer. In the process of etching the wiring layer through the connecting hole, the barrier ring can prevent the conductive object formed by sputtering from diffusing out, thereby avoiding the formation of the leakage path of the circuit/device, and thus improving the isolation performance of the connecting post.

As shown in FIG. 1 to FIG. 4, the semiconductor structure provided in this embodiment includes a substrate 10 and a film layer structure 20 arranged on the substrate 10. A material of the substrate 10 may include silicon, germanium, or silicon germanium and the like, and this embodiment does not limit the material of the substrate 10. It is worth noting that the semiconductor structure in this embodiment may be a semiconductor structure in a dynamic random access memory (DRAM), wherein the DRAM includes a semiconductor structure and a capacitor structure. The semiconductor structure is connected to the capacitor structure to read data from the capacitor structure or write data into the capacitor structure by means of the semiconductor structure. Of course, the semiconductor structure in this embodiment may also be other semiconductor structures, which is not limited in this embodiment.

A side of the film layer structure 20 facing away from the substrate 10 is provided with a wiring layer 30, wherein the wiring layer 30 is a circuit with a certain pattern. For example, the wiring layer 30 may be a copper layer. Of course, the wiring layer 30 may also be made of a conductive material such as gold.

In the above implementation, the film layer structure 20 may include a shallow trench isolation layer 202 and an interlayer isolation layer 201 that are stacked, wherein the shallow trench isolation layer 202 and the interlayer isolation layer 201 both are arranged between the substrate 10 and the wiring layer 30, and the interlayer isolation layer 201 is arranged close to the wiring layer 30. The shallow trench isolation layer 202 is configured to form a shallow trench isolation structure, and the interlayer isolation layer 201 is configured to achieve insulation between the shallow trench isolation layer 202 and the wiring layer 30.

In this embodiment, a side of the substrate 10 facing away from the film layer structure 20 is provided with a connecting hole extending to the wiring layer 30, and a hole wall of the connecting hole is provided with an insulating layer 50. The insulating layer 50 only covers the hole wall of the connecting hole, but does not fill in the connecting hole. Exemplarily, a material of the insulating layer 50 may include an insulating material such as silicon oxide. Of course, the insulating layer 50 may also be an insulating material such as silicon oxynitride.

The insulating layer 50 is provided with a barrier ring 40, wherein an end of the barrier ring 40 is joined to the wiring layer 30, and a center line of the barrier ring 40 is arranged collinearly with a center line of the connecting hole 601. The diffusibility of the barrier ring 40 is less than that of the wiring layer 30. That is, the diffusibility of a material constituting the barrier ring 40 is smaller than that of a material constituting the wiring layer 30. Exemplarily, the barrier ring 40 may be a tungsten ring. Of course, the barrier ring 40 may also be made from other materials whose diffusibility is less than the diffusibility of the wiring layer 30. The diffusibility refers to diffusion performance of particles, which may be, for example, diffusivity of the particles.

In the implementation where the film layer structure 20 includes the shallow trench isolation layer 202 and the interlayer isolation layer 201 that are stacked, a length of the barrier ring 40 along a direction of the center line may be less than a thickness of the interlayer isolation layer 201, such that the barrier ring 40 is positioned in the interlayer isolation layer 201.

Figure 3:
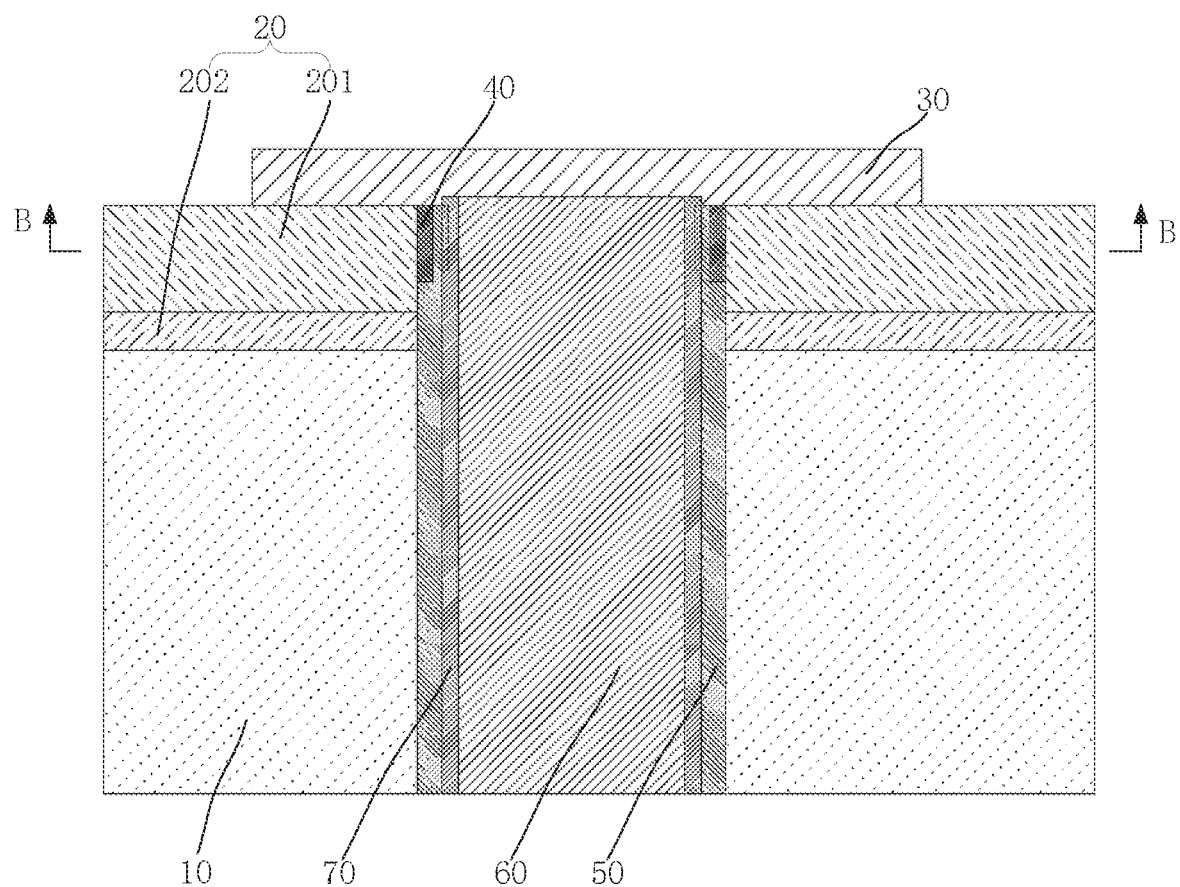
FIG. 3 is a schematic structural diagram II of a semiconductor structure according to an embodiment of the present disclosure.

A connecting post 60 is arranged in the connecting hole, and the connecting post 60 fills in the connecting hole, wherein an end of the connecting post 60 is joined to the wiring layer 30 to implement an electrical connection between the connecting post 60 and the wiring layer 30. Exemplarily, a material of the connecting post 60 may be a conductive material such as copper and tungsten. A width (a size in a horizontal direction as shown in FIG. 1 and FIG. 3) of the connecting post 60 may be 2 μm to 10 μm, such as 2 μm, 5 μm, and 10 μm, etc. A length (a size in a vertical direction as shown in FIG. 1 and FIG. 3) of the connecting post 60 may be 5 μm to 100 μm, such as 5 μm, 50 μm, 100 μm, and so on. It is worth noting that to improve connection performance between the connecting post 60 and the wiring layer 30, a part of the connecting post 60 extends into the wiring layer 30. For example, the connecting hole may be formed by means of etching, and a part of the connecting hole extends into the wiring layer 30 (not penetrating through the wiring layer 30).

The insulating layer 50 is provided with the barrier ring 40, wherein an end of the barrier ring 40 is joined to the wiring layer 30, and the diffusibility of the barrier ring 40 is less than that of the wiring layer 30. In the process of etching the wiring layer 30, the conductive object constituting the wiring layer 30 may sputter on the hole wall of the connecting hole close to the wiring layer 30 (dashed-line regions in FIG. 1 and FIG. 3). Because the diffusivity of the conductive object on the barrier ring 40 is smaller, the barrier ring 40 can prevent the conductive object formed by sputtering from diffusing out.

In the semiconductor structure provided by this embodiment, the film layer structure 20 is arranged on the substrate 10, a side of the film layer structure 20 facing away from the substrate 10 is provided with the wiring layer 30, and a side of the substrate 10 facing away from the film layer structure 20 is provided with a connecting hole extending to the wiring layer 30, and an insulating layer 50 is arranged on a hole wall of the connecting hole. The insulating layer 50 is provided with the barrier ring 40, wherein an end of the barrier ring 40 is joined to the wiring layer 30, a center line of the barrier ring 40 is arranged collinearly with a center line of the connecting hole, and the diffusibility of the barrier ring 40 is less than that of the wiring layer 30. The connecting hole is provided with the connecting post 60 joined to the wiring layer 30. By providing the barrier ring 40, after a part of the wiring layer 30 is etched along the connecting hole, the barrier ring 40 can prevent the conductive object formed by sputtering during etching from diffusing out, thereby avoiding the formation of the leakage path of the circuit/device, and thus improving the isolation performance of the connecting post 60.

With continued reference to FIG. 1 to FIG. 4, in some implementations, the barrier ring 40 may be arranged on an inner wall of the insulating layer 50. In other implementations, the barrier ring 40 may be arranged on an outer wall of the insulating layer 50. It should be noted that the inner wall of the insulating layer 50 is a sidewall of the insulating layer 50 close to the center line of the connecting hole, and the outer wall of the insulating layer 50 is a sidewall of the insulating layer 50 far away from the center line of the connecting hole.

Figure 2:
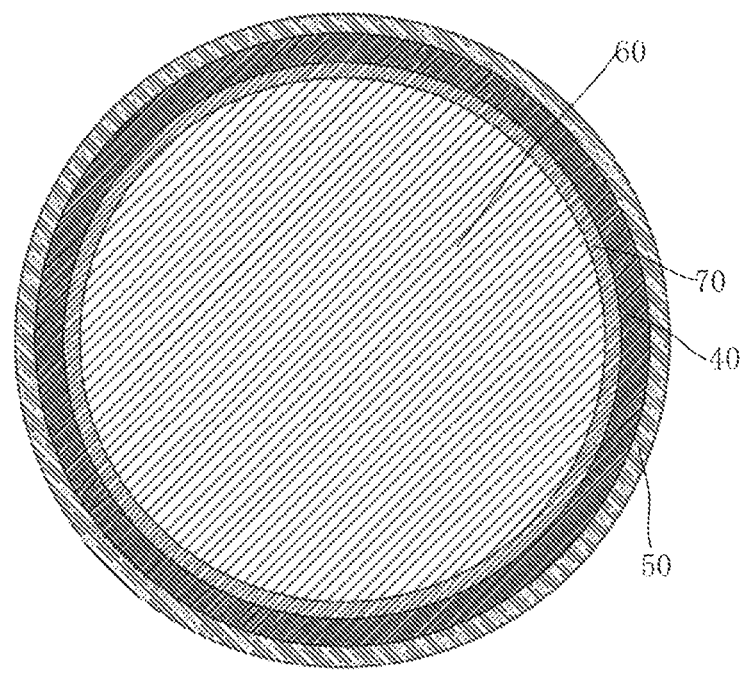
FIG. 2 is a sectional view along an A-A direction of FIG. 1.

With continued reference to FIG. 1 and FIG. 2, in the implementation where the barrier ring 40 is arranged on the inner wall of the insulating layer 50, an annular barrier trench may be formed on the inner wall of the insulating layer 50, and a center line of the annular barrier trench is arranged collinearly with the center line of the connecting hole. The barrier ring 40 is housed in the annular barrier trench to prevent the barrier ring 40 from protruding from the inner wall of the insulating layer 50, thereby improving compactness of the semiconductor structure. A wall thickness of the barrier ring 40 is equal to a depth of the annular barrier trench along a direction perpendicular to the center line of the annular barrier trench, such that the inner wall of the barrier ring 40 is flush with that of the insulating layer 50. Of course, the barrier ring 40 may also be only attached to the inner wall of the insulating layer 50.

Figure 4:
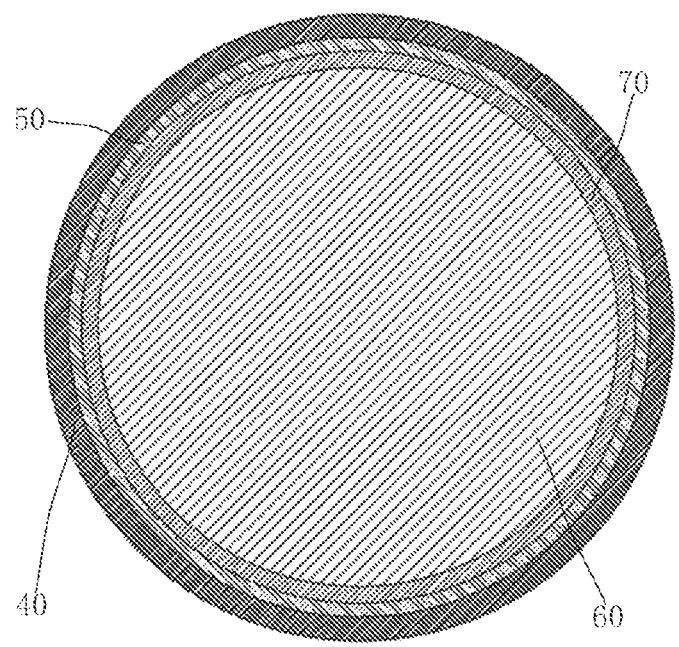
FIG. 4 is a sectional view along a B-B direction of FIG. 3.

With continued reference to FIG. 3 and FIG. 4, in the implementation where the barrier ring 40 is arranged on the outer wall of the insulating layer 50, an annular barrier trench may be formed on the outer wall of the insulating layer 50, and a center line of the annular barrier trench is arranged collinearly with the center line of the connecting hole. The barrier ring 40 is housed in the annular barrier trench to improve the compactness of the semiconductor structure. The wall thickness of the barrier ring 40 is equal to the depth of the annular barrier trench along the direction perpendicular to the center line of the annular barrier trench, such that the outer wall of the barrier ring 40 is flush with that of the insulating layer 50. Of course, the barrier ring 40 may also be only attached to the outer wall of the insulating layer 50.

In the foregoing implementation, the wall thickness of the barrier ring 40 may be 0.07 μm to 0.2 μm, such as 0.07 μm, 0.1 μm, 0.2 μm, and so on. The thickness of the semiconductor structure may be 40 μm to 70 μm, such as 40 μm, 50 μm, 70 μm, and so on.

In the foregoing implementation, a conductive buffer layer 70 may be provided between the connecting post 60 and the insulating layer 50, wherein the conductive buffer layer 70 may be a tantalum layer to improve performance of the semiconductor structure.

Exemplarily, a thickness of the conductive buffer layer 70 may be equal to that of the insulating layer 50, and the thickness of the conductive buffer layer 70 and the thickness of the insulating layer 50 may both be 2500 Å to 5000 Å, such as 2500 Å, 3000 Å, 5000 Å, and so on. Of course, the thickness of the conductive buffer layer 70 may also be different from that of the insulating layer 50, which is not limited in this embodiment.

It is worth noting that in the implementation where the conductive buffer layer 70 is provided between the connecting post 60 and the insulating layer 50, the conductive buffer layer 70 is formed after a hole 301 is formed. That is, the conductive buffer layer 70 not only covers the insulating layer 50, a part of the conductive buffer layer 70 also extends into the wiring layer 30.

In other embodiments, there is also provided a method for fabricating a semiconductor structure, wherein this method is configured for fabricating the semiconductor structure in the above-mentioned embodiments. In the semiconductor structure fabricated by means of this method, a film layer structure is arranged on a substrate, a side of the film layer structure facing away from the substrate is provided with a wiring layer, a side of the substrate facing away from the film layer structure is provided with a connecting hole extending to the wiring layer, and an insulating layer is arranged on a hole wall of the connecting hole. A barrier ring is arranged on the insulating layer, wherein an end of the barrier ring is joined to the wiring layer, a center line of the barrier ring is arranged collinearly with a center line of the connecting hole, and diffusibility of the barrier ring is less than that of the wiring layer. A connecting post joined to the wiring layer is arranged in the connecting hole. By providing the barrier ring, after a part of the wiring layer is etched along the connecting hole, the barrier ring can prevent the conductive object formed by sputtering during etching from diffusing out, thereby avoiding the formation of the leakage path of the circuit/device, and thus improving the isolation performance of the connecting post.

Figure 5:
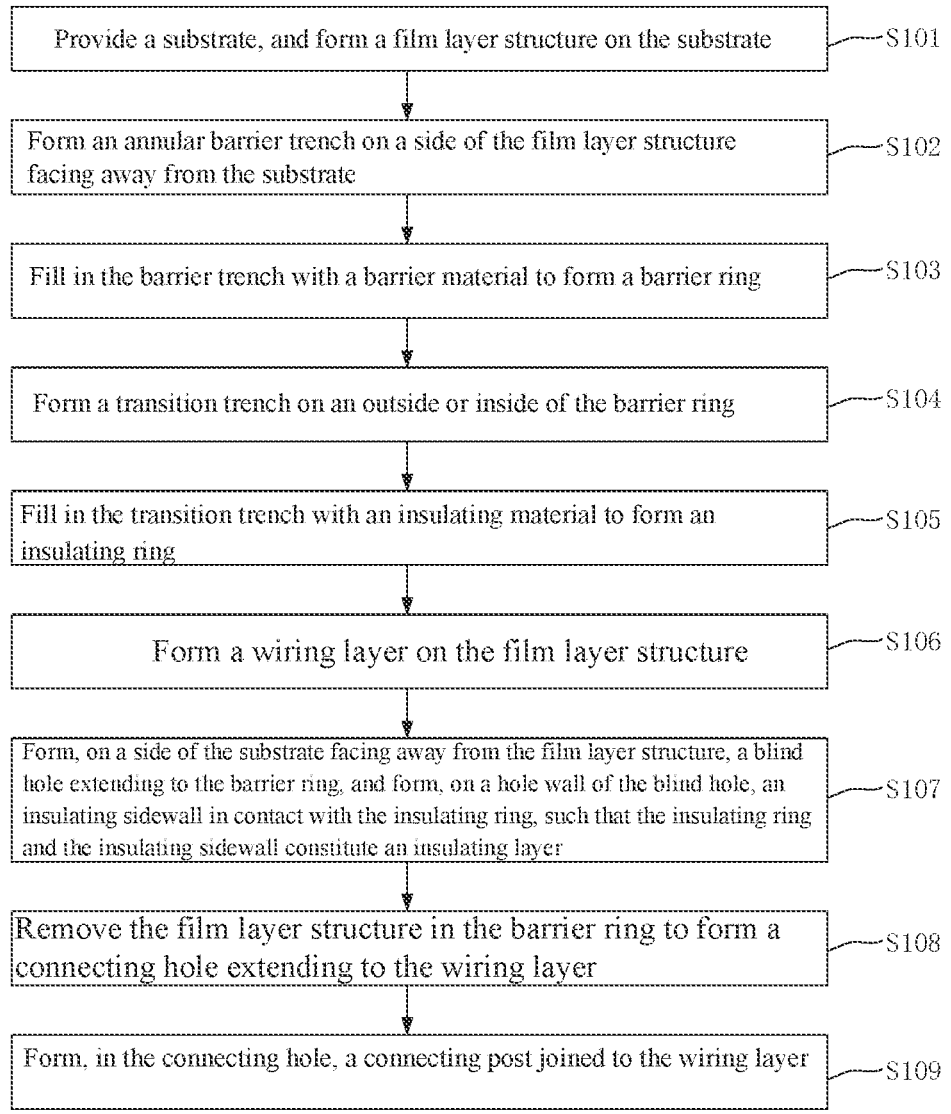
FIG. 5 is a flowchart of a method for fabricating a semiconductor structure according to an embodiment of the present disclosure.

Referring to FIG. 5, the method for fabricating a semiconductor structure provided by this embodiment includes:

S101: providing a substrate, and forming a film layer structure on the substrate.

Figure 6:
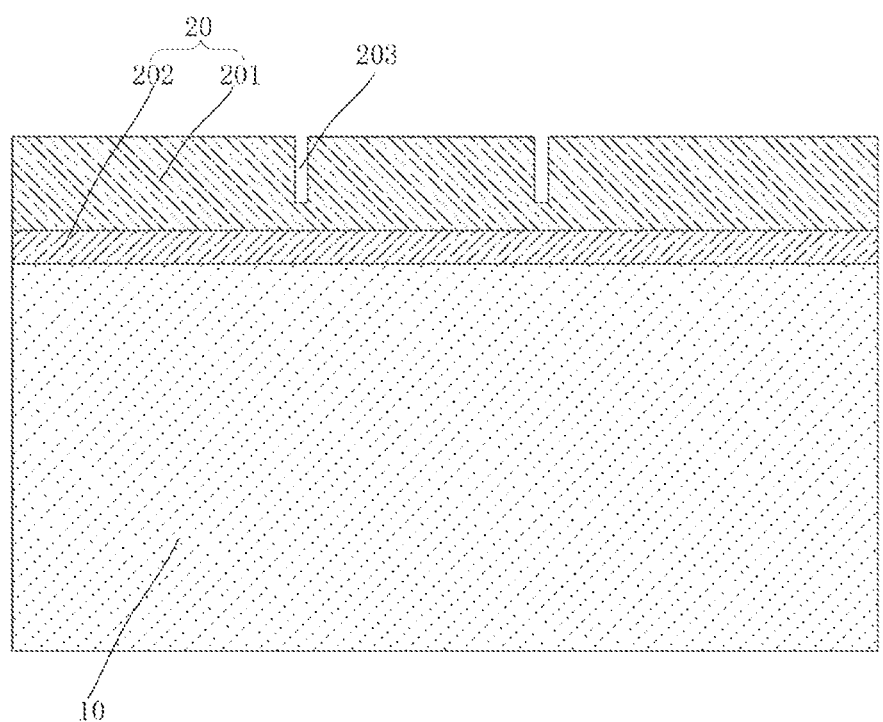
FIG. 6 is a schematic structural diagram after barrier trenches are formed by means of the method for fabricating a semiconductor structure according to an embodiment of the present disclosure.

Referring to FIG. 6, a material of the substrate 10 may include silicon, germanium or silicon germanium, and so on, and the material of the substrate 10 in this embodiment is not limited thereto. The film layer structure 20 may include a shallow trench isolation layer 202 and an interlayer isolation layer 201 stacked, wherein the shallow trench isolation layer 202 and the interlayer isolation layer 201 are both arranged on the substrate 10, and the interlayer isolation layer 201 is arranged far away from the substrate 10. The shallow trench isolation layer 202 is configured to form a shallow trench isolation structure, and the interlayer isolation layer 201 is configured to achieve insulation between the shallow trench isolation layer 202 and a film layer of a side of the interlayer isolation layer 201 far away from the shallow trench isolation layer 202.

After the film layer structure 20 is formed, the method for fabricating a semiconductor structure provided in this embodiment also includes:

S102: forming an annular barrier trench on a side of the film layer structure facing away from the substrate.

With continued reference to FIG. 6, for example, an annular barrier trench 203 may be formed on a side of the film layer structure 20 facing away from the substrate 10 by means of dry etching or wet etching.

After the annular barrier trench 203 is formed, the method for fabricating a semiconductor structure also includes:

S103: filling in the barrier trench with a barrier material to form a barrier ring.

Figure 7:
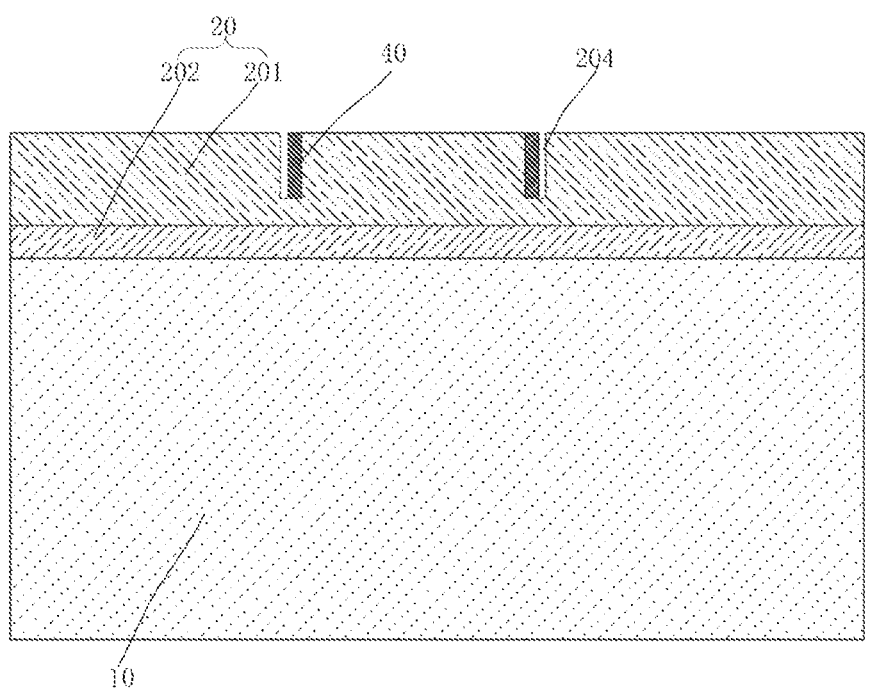
FIG. 7 is a schematic structural diagram after transition trenches are formed by means of the method for fabricating a semiconductor structure according to an embodiment of the present disclosure.

As shown in FIG. 7, for example, the barrier material may include tungsten, and the barrier material fills in the barrier trench 203. The corresponding barrier ring 40 may be formed by means of deposition or evaporation.

After the barrier ring 40 is formed, the method for fabricating a semiconductor structure provided in this embodiment also includes:

S104: forming a transition trench on an outside or inside of the barrier ring.

Figure 8:
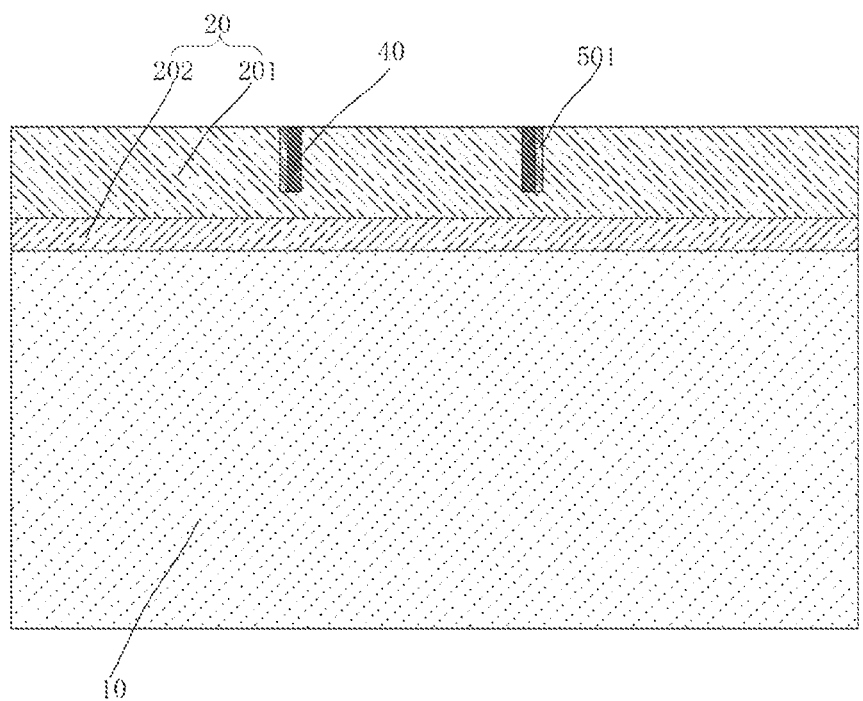
FIG. 8 is a schematic structural diagram after insulating rings are formed by means of the method for fabricating a semiconductor structure according to an embodiment of the present disclosure.

As shown in FIG. 8, a transition trench 204 is formed on a side of the film layer structure 20 facing away from the substrate 10, and the transition trench 204 may be sleeved on the outside of the barrier ring 40, or the barrier ring 40 may be sleeved on the outside (not shown) of the transition trench 204. The barrier ring 40 is joined to a trench wall of the transition trench 204.

After the transition trench 204 is formed, the method for fabricating a semiconductor structure also includes:

S105: filling in the transition trench with an insulating material to form an insulating ring.

Exemplarily, the insulating material may include oxide such as silicon oxide. Of course, the insulating material may also include silicon oxynitride and the like.

Referring to FIG. 1 and FIG. 8, after the insulating ring 501 is formed, the method for fabricating a semiconductor structure provided by this embodiment also includes:

S106: forming a wiring layer on the film layer structure.

Figure 9:
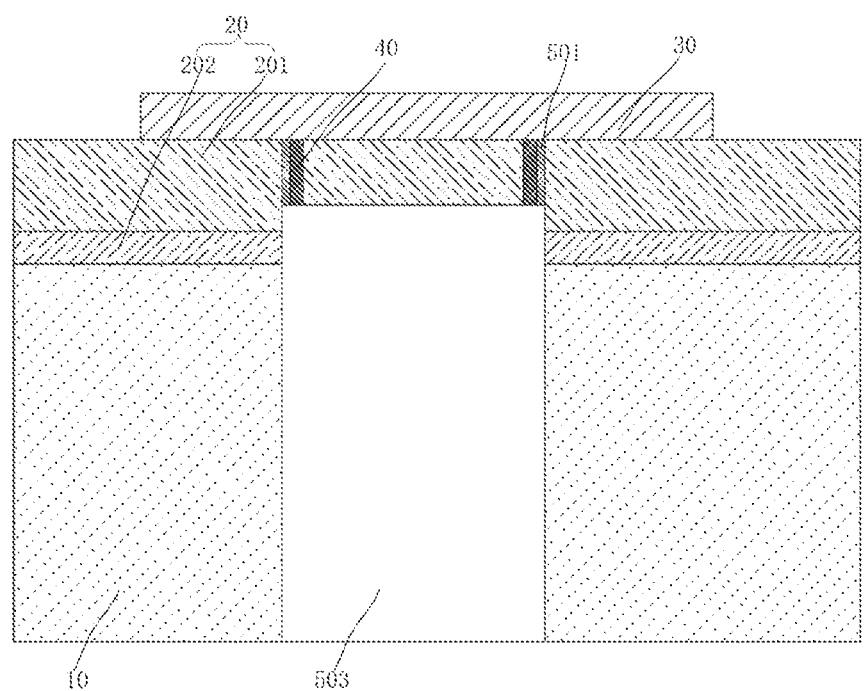
FIG. 9 is a schematic structural diagram after a blind hole is formed by means of the method for fabricating a semiconductor structure according to an embodiment of the present disclosure.

As shown in FIG. 9, for example, a conductive layer may be first formed on a side of the film layer structure 20 facing away from the substrate 10, and then a part of the conductive layer is removed by means of etching to form a wiring layer 30 with a certain circuit pattern. A material of the wiring layer 30 may include copper or the like.

After the wiring layer 30 is formed, the method for fabricating a semiconductor structure also includes:

S107: forming, on a side of the substrate facing away from the film layer structure, a blind hole extending to the barrier ring, and forming, on a hole wall of the blind hole, an insulating sidewall in contact with the insulating ring, such that the insulating ring and the insulating sidewall constitute an insulating layer.

Figure 10:
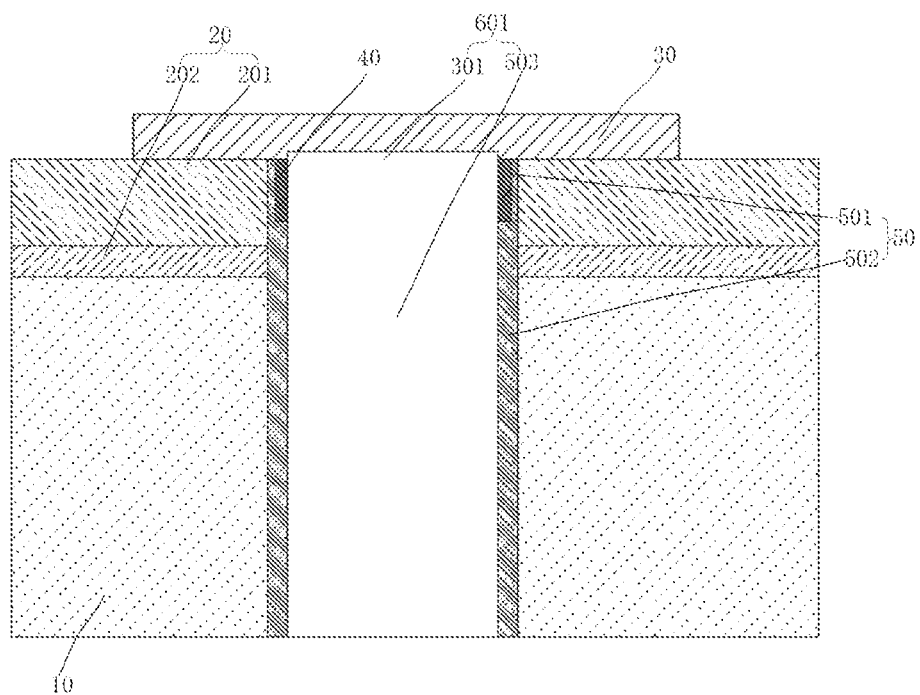
FIG. 10 is a schematic structural diagram after a hole is formed by means of the method for fabricating a semiconductor structure according to an embodiment of the present disclosure.

As shown in FIG. 9 and FIG. 10, in the implementation where the transition trench 204 is sleeved outside the barrier ring 40, a hole diameter of the blind hole 503 may be equal to an outer diameter of the transition trench 204, and a hole bottom of the blind hole 503 is joined to an end of the barrier ring 40 facing away from the wiring layer 30. In this way, an outer wall of the insulating sidewall 502 is flush with that of the insulating ring 501. A material of the sidewall of the insulating layer 50 may be the same as the material of the insulating ring 501, such that after the insulating sidewall 502 is formed, the integrated insulating layer 50 is formed between the insulating sidewall 502 and the insulating ring 501. By reasonably setting a thickness of the insulating sidewall 502 an inner wall of the insulating sidewall 502 may be ensured to be flush with that of the barrier ring 40 to improve the compactness of the semiconductor structure.

In the implementation where the barrier ring 40 is sleeved outside the transition trench 204, a diameter of the blind hole 503 may be equal to an outer diameter of the barrier ring 40, and the hole bottom of the blind hole 503 is joined to an end of the barrier ring 40 facing away from the wiring layer 30. In this way, the outer wall of the insulating sidewall 502 is flush with that of the barrier ring 40. A material of the sidewall of the insulating layer 50 may be the same as the material of the insulating ring 501, such that after the insulating sidewall 502 is formed, the integrated insulating layer 50 is formed between the insulating sidewall 502 and the insulating ring 501. By reasonably setting the thickness of the insulating sidewall 502 the inner wall of the insulating sidewall 502 may be ensured to be flush with that of the insulating ring 501 to improve the compactness of the semiconductor structure.

With continued reference to FIG. 1, FIG. 9, and FIG. 10, after the insulating sidewall 502 is formed, the method for fabricating a semiconductor structure provided by this embodiment also includes:

S108: removing the film layer structure in the barrier ring to form a connecting hole extending to the wiring layer.

Exemplarily, a part of the film layer structure 20 at the hole bottom of the blind hole 503 may be removed along the blind hole 503 by means of wet etching or dry etching, to form a connecting hole 601 extending to the wiring layer 30.

In some embodiments, the film layer structure 20 in the barrier ring 40 is etched through the blind hole 503 to form a hole 301, wherein the hole 301 extends into a part of the wiring layer 30, and the hole 301 and the blind hole 503 constitute the connecting hole 601.

After the connecting hole 601 is formed, the method also includes:

S109: forming, in the connecting hole, a connecting post combined with the wiring layer.

Figure 11:
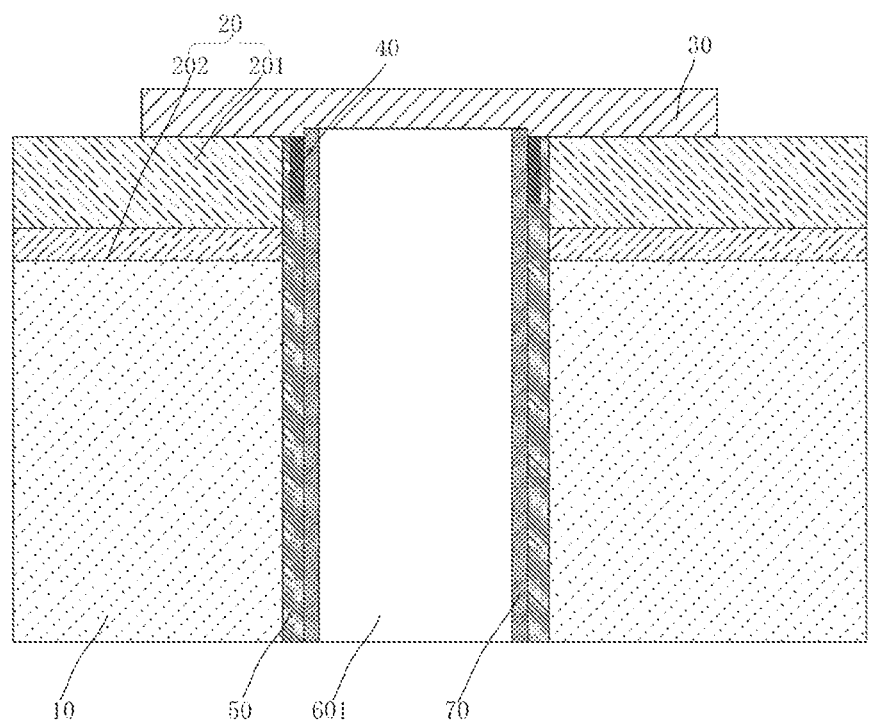
FIG. 11 is a schematic structural diagram after a conductive buffer layer is formed by means of the method for fabricating a semiconductor structure according to an embodiment of the present disclosure.
Figure 12:
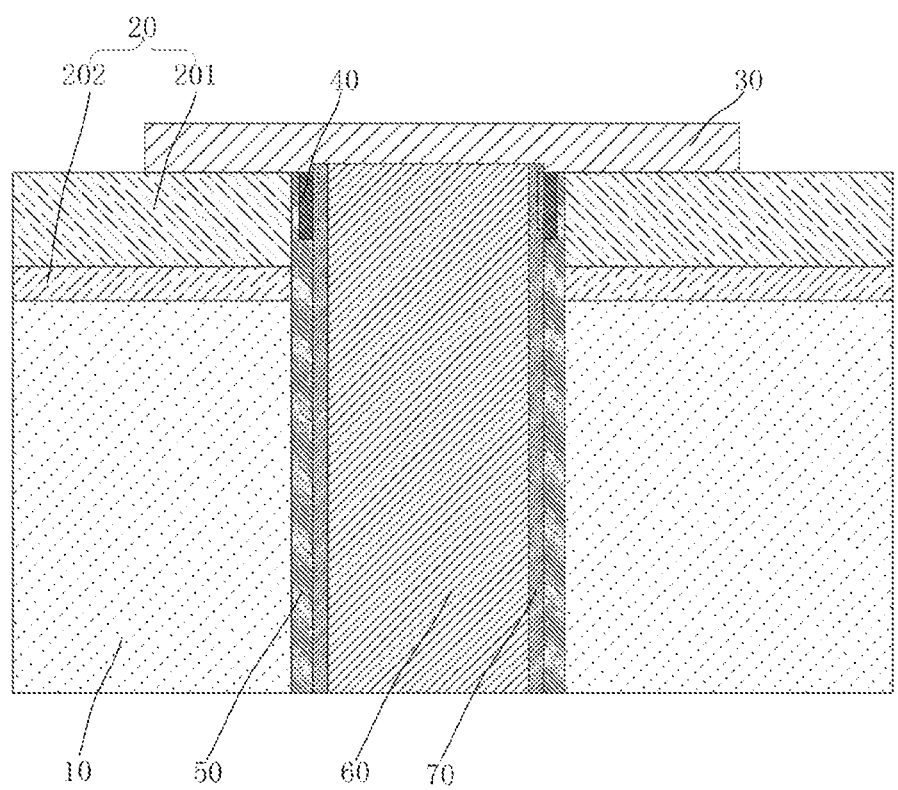
FIG. 12 is a schematic structural diagram after a connecting post is formed by means of the method for fabricating a semiconductor structure according to an embodiment of the present disclosure.

As shown in FIG. 11 and FIG. 12, for example, a conductive material may be filled in the connecting hole 601 by means of deposition or evaporation to form the connecting post 60. The conductive material may include copper, tungsten, and the like.

In the implementation where the hole 301 extends into the wiring layer 30, a part of the connecting post 60 (for example, a top portion of the connecting post 60 as shown in FIG. 11 and FIG. 12) is covered in the wiring layer 30, such that connection performance between the connecting post 60 and the wiring layer 30 can be improved.

In this embodiment, after the connecting post 60 is formed, the method also includes: forming, on the substrate 10, a contact pad (not shown) joined to an end of the connecting post 60 facing away from the wiring layer 30, to achieve an electrical connection between the contact pad and the wiring layer 30 by means of the connecting post 60. Exemplarily, a groove may be formed on a side of the substrate 10 facing away from the wiring layer 30, wherein the groove exposes an end of the connecting post 60 facing away from the wiring layer 30. Next, a conductive material is filled in the groove to form the contact pad connecting the connecting post 60, wherein a material of the contact pad may be tungsten or the like.

In the semiconductor structure fabricated by the method for fabricating a semiconductor structure provided in this embodiment, the film layer structure 20 is arranged on the substrate 10, a side of the film layer structure 20 facing away from the substrate 10 is provided with the wiring layer 30, and a side of the substrate 10 facing away from the film layer structure 20 is provided with a connecting hole 601 extending to the wiring layer 30, and an insulating layer 50 is arranged on a hole wall of the connecting hole 601. The insulating layer 50 is provided with the barrier ring 40, wherein an end of the barrier ring 40 is joined to the wiring layer 30, a center line of the barrier ring 40 is arranged collinearly with a center line of the connecting hole 601, and the diffusibility of the barrier ring 40 is less than that of the wiring layer 30. The connecting hole 601 is provided with the connecting post 60 joined to the wiring layer 30. By providing the barrier ring 40, after a part of the wiring layer 30 is etched along the connecting hole 601, the barrier ring 40 can prevent the conductive object formed by sputtering during etching from diffusing out, thereby avoiding the formation of the leakage path of the circuit/device, and thus improving the isolation performance of the connecting post 60.

In the foregoing implementation, after the wiring layer 30 is formed, the method also includes: thinning the substrate 10. It is easy to control the thickness of the semiconductor structure by thinning the substrate. Exemplarily, a side of the substrate 10 facing away from the wiring layer 30 may be etched to thin the substrate 10. Of course, the side of the substrate 10 facing away from the wiring layer 30 may also be processed by means of chemical mechanical polishing (CMP), which also can thin the substrate 10.

As shown in FIG. 11 and FIG. 12, in this embodiment, before the connecting post 60 is formed, the method also includes: forming a conductive buffer layer 70 on the insulating layer 50, wherein the conductive buffer layer 70 covers the insulating layer 50. That is, after the connecting post 60 is formed, the conductive buffer layer 70 is sandwiched between the connecting post 60 and the insulating layer 50 to improve the performance of the semiconductor structure. Exemplarily, the conductive buffer layer 70 may be a tantalum layer.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

What is claimed is:

1. A semiconductor structure, comprising: a substrate and a film layer structure arranged on the substrate, a side of the film layer structure far away from the substrate being provided with a wiring layer, a side of the substrate facing away from the film layer structure being provided with a connecting hole extending to the wiring layer, and an insulating layer being arranged on a hole wall of the connecting hole;
   wherein a barrier ring is arranged on the insulating layer, an end of the barrier ring being joined to the wiring layer, a center line of the barrier ring being arranged collinearly with a center line of the connecting hole, diffusibility of the barrier ring being less than diffusibility of the wiring layer, a connecting post being arranged in the connecting hole, and the connecting post being joined to the wiring layer; and,
   wherein, the film layer structure comprises a shallow trench isolation layer and an interlayer isolation layer stacked, the shallow trench isolation layer and the interlayer isolation layer being both arranged between the wiring layer and the substrate, the interlayer isolation layer being arranged close to the wiring layer, a length of the barrier ring along a direction of the center line being less than a thickness of the interlayer isolation layer.

2. The semiconductor structure according to claim 1, wherein the barrier ring is arranged on an inner wall of the insulating layer.

3. The semiconductor structure according to claim 2, wherein an annular barrier trench is arranged on the inner wall of the insulating layer, the barrier ring being arranged in the annular barrier trench.

4. The semiconductor structure according to claim 1, wherein the barrier ring is arranged on an outer wall of the insulating layer.

5. The semiconductor structure according to claim 4, wherein an annular barrier trench is arranged on the outer wall of the insulating layer, the barrier ring being arranged in the annular barrier trench.

6. The semiconductor structure according to claim 1, wherein the wiring layer is a copper layer, the barrier ring being a tungsten ring.

7. The semiconductor structure according to claim 1, wherein a ring wall thickness of the barrier ring is 0.07 μm-0.2 μm.

8. The semiconductor structure according to claim 1, wherein a conductive buffer layer is provided between the connecting post and the insulating layer.

9. The semiconductor structure according to claim 8, wherein a thickness of the conductive buffer layer and a thickness of the insulating layer both range from 2,500 Å to 5,000 Å.

10. The semiconductor structure according to claim 8, wherein the conductive buffer layer is a tantalum layer.

11. A method for fabricating a semiconductor structure, comprising:
   providing a substrate, and forming a film layer structure on the substrate;
   forming an annular barrier trench on a side of the film layer structure facing away from the substrate;
   filling in the barrier trench with a barrier material to form a barrier ring;
   forming an annular transition trench on an outside or inside of the barrier ring;
   filling in the transition trench with an insulating material to form an insulating ring;
   forming a wiring layer on the film layer structure;
   forming, on a side of the substrate facing away from the film layer structure, a blind hole extending to the barrier ring, and forming, on a hole wall of the blind hole, an insulating sidewall in contact with the insulating ring, such that the insulating ring and the insulating sidewall constitute an insulating layer;
   removing the film layer structure in the barrier ring to form a connecting hole extending to the wiring layer; and
   forming, in the connecting hole, a connecting post joined to the wiring layer; and,
   wherein, the film layer structure comprises a shallow trench isolation layer and an interlayer isolation layer stacked, the shallow trench isolation layer and the interlayer isolation layer being both arranged between the wiring layer and the substrate, the interlayer isolation layer being arranged close to the wiring layer, a length of the barrier ring along a direction of the center line being less than a thickness of the interlayer isolation layer.

12. The method for fabricating a semiconductor structure according to claim 11, wherein before forming the connecting post, the method further comprises:
   forming a conductive buffer layer on the insulating layer.

13. The method for fabricating a semiconductor structure according to claim 11, wherein the removing the film layer structure in the barrier ring to form a connecting hole extending to the wiring layer comprises:
   etching the film layer structure in the barrier ring through the blind hole to form a hole, wherein the hole extends into a part of the wiring layer, and the hole and the blind hole constitute the connecting hole.

14. The method for fabricating a semiconductor structure according to claim 11, wherein after forming the wiring layer, the method further comprises:
   thinning the substrate.

15. The method for fabricating a semiconductor structure according to claim 11, wherein after forming the connecting post, the method further comprises:
   forming, on the substrate, a contact pad joined to an end of the connecting post facing away from the wiring layer.

* * * * *